United States Patent [19]
Kim et al.

[11] Patent Number: 5,909,086
[45] Date of Patent: Jun. 1, 1999

[54] PLASMA GENERATOR FOR GENERATING UNIPOLAR PLASMA

[75] Inventors: Soo-In Kim, Seoul, Rep. of Korea; Vladimir Nikolaevich Lisin, Moscow, Russian Federation; Bekker German, Moscow, Russian Federation; Malivanov Sergei, Moscow, Russian Federation

[73] Assignee: Jump Technologies Limited, Sheung Wan, The Hong Kong Special Administrative Region of the People's Republic of China

[21] Appl. No.: 08/719,057

[22] Filed: Sep. 24, 1996

[51] Int. Cl.⁶ ........................................................ H01J 7/24
[52] U.S. Cl. .................... 315/111.21; 315/221; 315/282; 315/39.51; 422/186.16; 361/234
[58] Field of Search ............................... 315/105, 111.01, 315/111.21, 111.41, 111.71, 221, 278, 282, 39.51, 39.53; 313/231.31, 633, 231.71, 246, 325; 422/186.16, 168; 361/235, 213, 234

[56] References Cited

U.S. PATENT DOCUMENTS

| | | | |
|---|---|---|---|
| 4,341,947 | 7/1982 | Komura et al. ................ | 315/111.21 X |
| 4,370,539 | 1/1983 | Garlanov et al. .................... | 315/331 X |
| 5,003,226 | 3/1991 | McGeoch ............................ | 315/111.81 |
| 5,041,760 | 8/1991 | Koloc .................................... | 315/11.41 |
| 5,115,168 | 5/1992 | Shoda et al. ............................ | 315/223 |
| 5,130,003 | 7/1992 | Conrad .................................... | 204/176 |
| 5,655,210 | 8/1997 | Gregoire et al. ........................ | 422/186 |

*Primary Examiner*—Benny Lee
*Assistant Examiner*—Haissa Philogene
*Attorney, Agent, or Firm*—Jacobson, Price, Holman & Stern, PLLC

[57] ABSTRACT

The present invention relates to a plasma generator to apply cold plasma in the fields of medicine, biology, ecological recovery, activation, purification, special processing of gases, liquids and solid substances as well as other areas of technology and science. A plasma generator of the invention comprises: a power source; an electronic oscillator constructed on an amplifying (control) element which is connected to a low voltage input section; a resonance transformer having a low voltage input section and a high voltage output section; and, one pin of the high voltage output section of the resonance transformer which is connected to a discharge electrode. The present invention provides a universal plasma generator with decreased mass and dimensions which provides unipolar plasma for plasma therapy and activation of substantial media by virtue of the field.

13 Claims, 16 Drawing Sheets

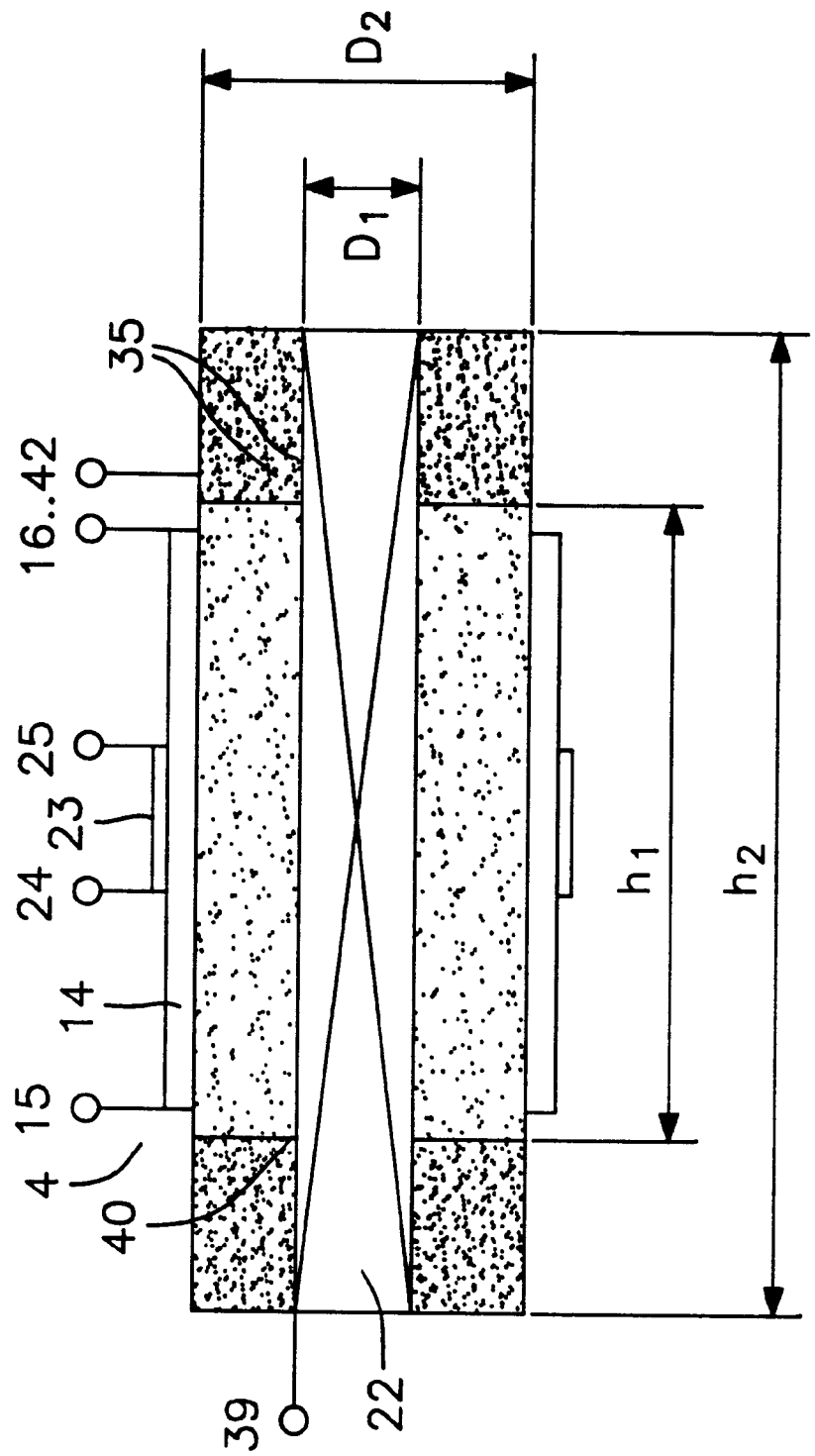

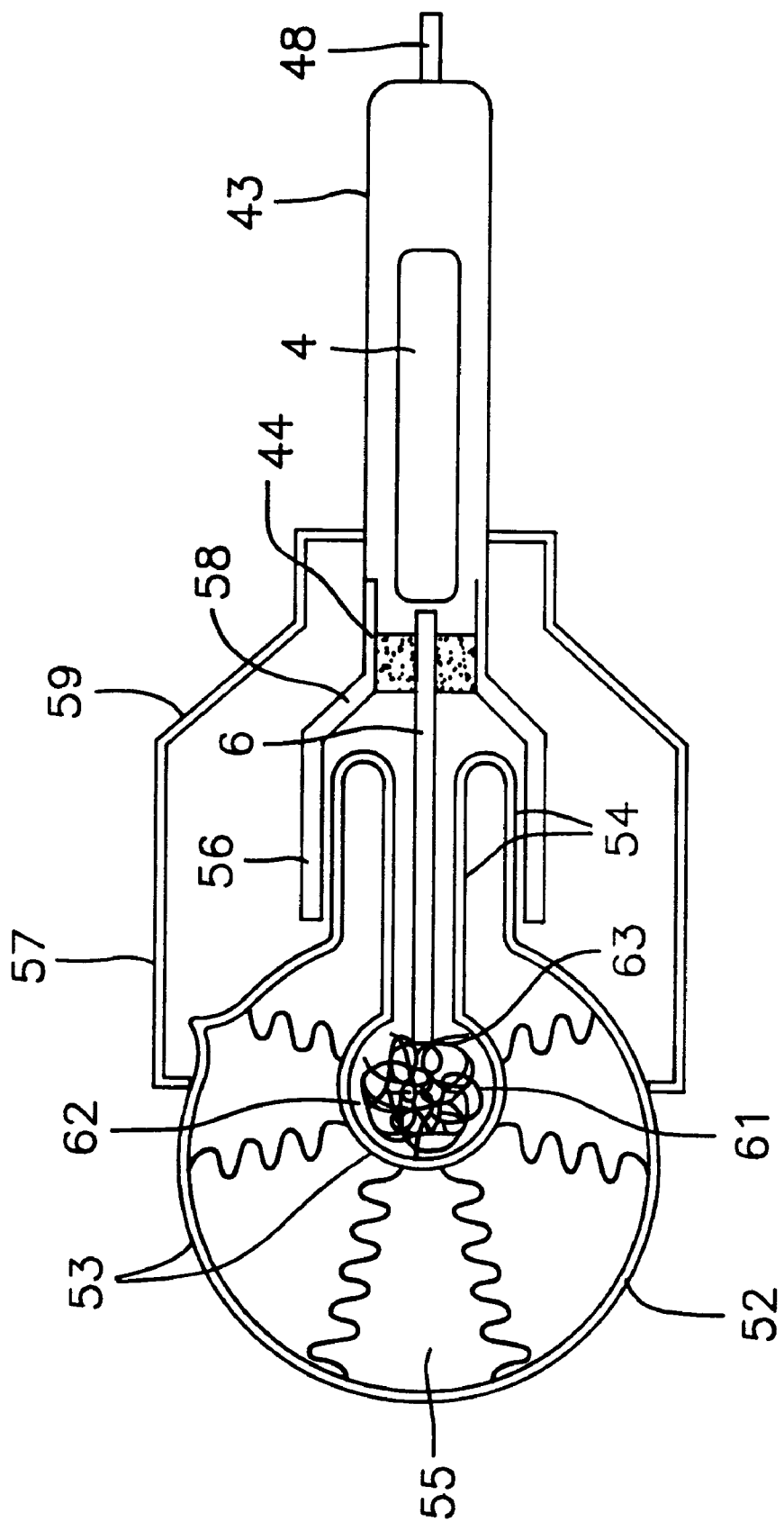

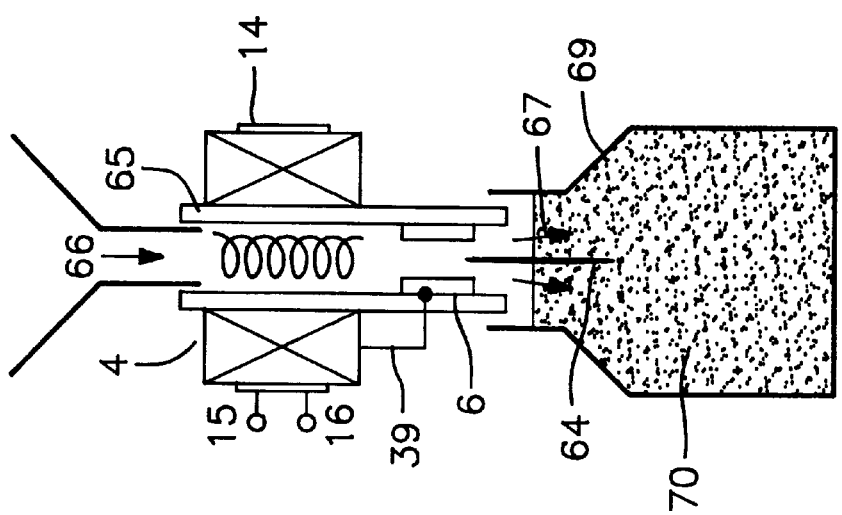
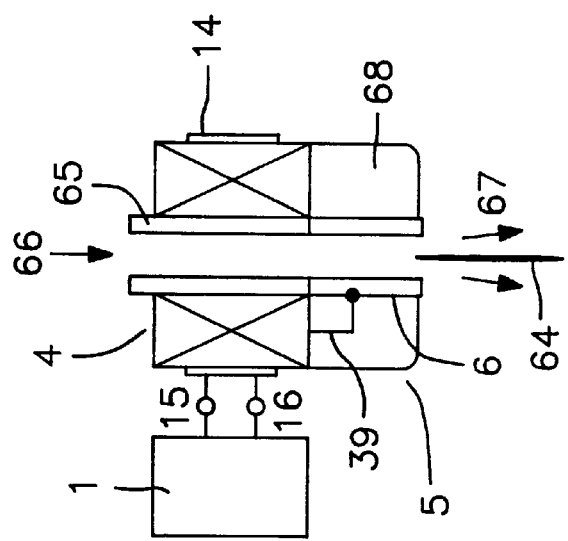

PLASMA GENERATOR FOR GENERATING UNIPOLAR PLASMA

BACKGROUND OF THE INVENTION

1. Field of the Invention

The present invention relates to a plasma generator, more specifically, to a plasma generator to apply cold plasma in the fields of medicine, biology, ecological recovery, activation, purification, special processing of gases, liquids and solid substances as well as other areas of technology and science.

2. Description of the Related Art

Plasmotrons which can generate plasma under normal atmospheric pressure conditions with temperature up to thousands degrees Celsius are well known in the art. The thermal heating of plasma is acted by classical electromagnetic induction, via induction heating of electrically conducting media in alternating electromagnetic field of the inductor. The device consists of high voltage AC generator, quartz pipe-shaped case and liquid-cooled inductor, an inductance coil having large numbers of turns. In order to generate the induction discharges in a volume of approximately 1 liter (0.001 $m^3$), a multi-turn inductor of 0.1 m diameter is essentially required, the inductor reactance being raised greatly at 1 MHz and higher frequencies. Naturally, it is very difficult to match the high voltage generator with the inductor reactance, and the effective output power is decreased. Accordingly, the prior art plasmotron has revealed some drawbacks of large dimensions, poor efficiency and very high plasma temperature, which, in turn, restricted its operational features considerably, especially in medicine, biology and ecological treatment.

The other types of plasma generator have been used in electric discharge therapy device which comprise electronic oscillator, modulation unit, output resonance transformer and rod-like discharge electrode. A plasma beam is induced between the end of the electrode and the biological object. The electronic oscillator produces oscillations in 200 kHz through 300 kHz frequency range. The modulator which can be constructed in transistors periodically switches on and off the signal of the oscillator at about 3 kHz to 5 kHz rate. Thus, the modulator provides impact excitation of resonance transformer circuit, which brings about measured output emission in a form of corona discharge between the electrode and the object. The device produces favorable therapeutic effect to treat a number of diseases, disorders, pathologies, mainly due to the induced heat in the specified areas of body.

The device, however, has also revealed shortcomings that the discharge transformation from corona to spark form may be appeared and the conduction currents origination directly in the tissue. The classical corona and spark discharge inevitably results in ionization, electric break-through and thermal heating of the air gap between the inducing electrode and the body which is used as the second electrode. Moreover, direct resonance action of the device by virtue of field is shunted as a result of ionization of substantial medium and chaotic heat motion of particles in the discharge area.

The problems of the prior art plasma generator, in principle, have limited all the direct use of electromagnetic field in medicine, biology and directed activation of substantial media such as gases, liquids and solid bodies. Under the circumstances, there are strong reasons for exploring and developing alternative type of a novel plasma generator to solve said problems in the art.

SUMMARY OF THE INVENTION

A primary object of the invention is, therefore, to provide a universal plasma generator with decreased mass and dimensions which provides unipolar plasma for plasma therapy and activation of substantial media by virtue of the field.

BRIEF DESCRIPTION OF THE DRAWINGS

The above objects of the present invention will become apparent from the following descriptions given in conjunction with the accompanying drawings, in which:

FIG. 8 shows an example of the parametric resonance transformer which combines functions of transfer and forming lines;

FIG. 10 is a brief cross-sectional view of the generator high voltage unit with plasma head;

FIG. 11A shows plasmon head (working probe) with two-section metal-dielectric tube electrode assembly; gas and/or aerosol flow is passed through this electrode assembly;

FIG. 11B shows plasmotron head with multi-section tube electrode assembly for activation of liquids, fluids, for instance, water solutions (systems);

DETAILED DESCRIPTION OF THE INVENTION

A plasma generator of the invention comprises:

a power source;

an electronic oscillator constructed on an amplifying (control) element which is connected to a low voltage input section;

a resonance transformer having a low voltage input section and a high voltage output section; and, one pin of the high voltage output section of the resonance transformer which is connected to a discharge electrode.

A preferred embodiment of the present invention is explained in detail with references on the accompanying drawings, which should not be taken to limit the scope of the invention. In particular, the description of certain parts or components of the preferred embodiment and their connections and interactions given below should not be taken to limit the scope of the present invention.

Figure 1:
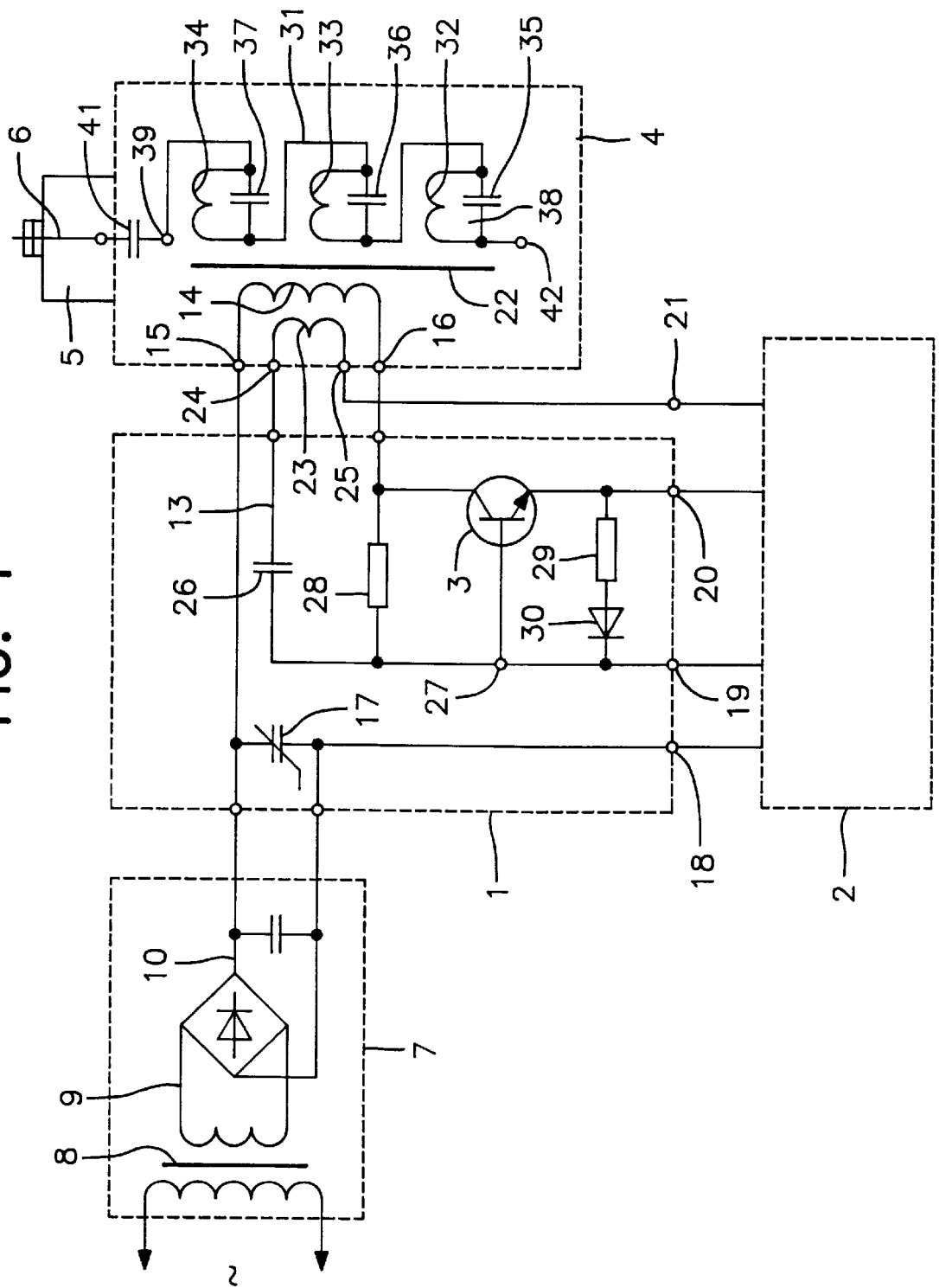
FIG. 1 is a structural circuit diagram of the plasma generator of the present invention.

Referring to FIG. 1, a structural circuit diagram of the plasma generator of the present invention is shown schematically.

The plasma generator employs a conventional DC power source (7), which consists of AC voltage reducing transformer (8), bridge rectifier (9) and capacitor filter (10). The structure of the primary resonance circuit (13) constituting the electronic oscillator (1) involves non-linear capacitor (17) as well as the input low voltage section (14) of the resonance transformer (4). The primary resonance circuit (13) also includes an amplifying (control) element (3), e.g., a transistor.

The plasma generator is optionally equipped with a drive unit (2) which is connected to the amplifying (control) element (3) and provides cyclic switching on and off of the amplifying (control) element (3) or another special drive mode. The drive unit (2) can be made with an electronic integrated circuit or diode-resistor assembly.

The parametric resonance transformer (4) can be realized as an induction multi-turn coil transformer. In many cases, it makes sense to furnish the resonance transformer (4) with ferrite core (22). Feedback section (23) of the resonance transformer (4) is connected to control input (27) of the amplifying (control) element (3). A junction capacitor (26), correction resistors (28, 29) and diode (30) can be used for optimal operational conditions. The high voltage output section (31) of the resonance transformer (4) that is the secondary multi-layer winding, is placed directly at the ferrite core (22). This high voltage output section (31) consists of inductive layers (32, 33, 34 and so on), whose number can be 10 to 20. The layer capacitance (35, 36, 37) which forms a cell (38) of transfer line in conjunction with the inductive layers. The line is combined with the electric circuit of the parametric transformer secondary winding. The lead (39) of the secondary winding internal layer is connected to rod-like electrode (6) in plasma head (5) via dividing (coupling) capacitor (41). The lead (42) of the secondary winding external layer can be either isolated or connected to the lead (16) of the primary winding (14). The primary winding (14) can be winded in one layer atop the secondary winding. The feedback winding (23) can be made as one turn placed at the symmetry plane, in the central part of the resonance transformer (4) (see: FIG. 8).

Figure 9A:
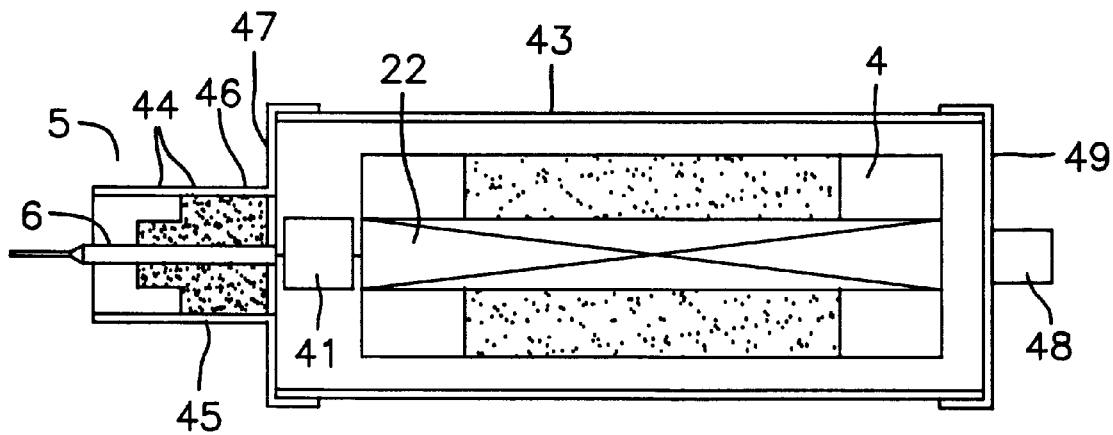
FIG. 9A is a brief cross-sectional view of the generator high voltage unit with plasma head and unipolar rod-like electrode.
Figure 9B:
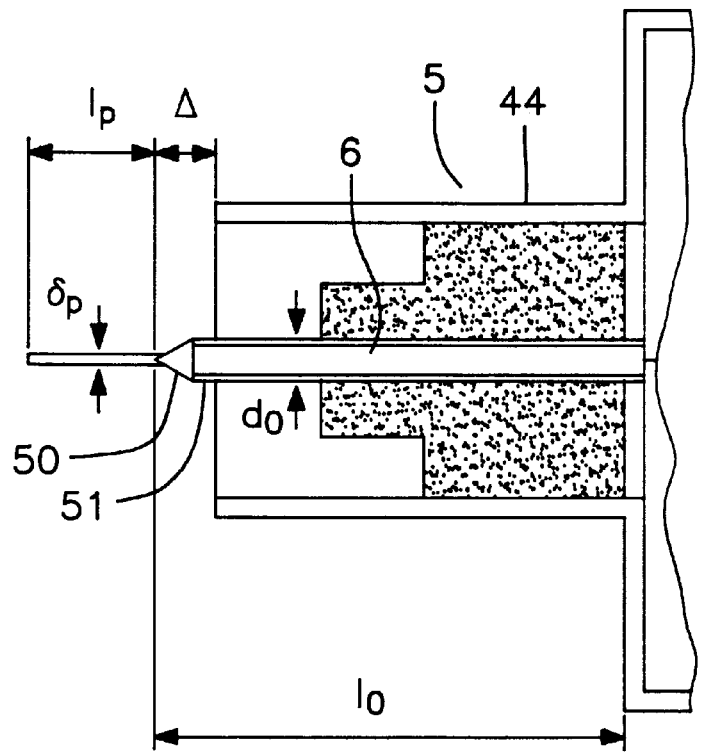
FIG. 9B is a brief cross-sectional view of the unipolar rod-like electrode.

As can be seen in FIGS. 9A and 9B, the resonance transformer (4) and the dividing high-voltage capacitor (41) can be assembled in dielectric cylinder casing (43) such as fluoroplastic and teflon so on. The plasma head (5) can be a kind of dielectric cap (44) with thread or fingered bushing coupling, fastener (46) at the seat (45) to the front end (47) of the casing. The electronic oscillations are supplied over the input (48) at the rear end (49) of the casing. The discharge rod-like electrode (6) has sharp, pointed emitter (50). The electrode (6) can be made, for instance, of bronze and it can have electrically conducting film coating, plating (51), for instance, gold.

As can be seen in FIG. 10, the plasma head is a kind of double-wall dielectric (glass) bulb (52). The space between the walls (55) can be filled with low pressure (for example, 1 to 20 mm Hg, that is 133.3 to 2,667 newton per square meter), normal atmospheric pressure or high pressure gas of a neutral gas, for example, helium, argon, neon, etc. The discharge electrode (6) comes to the internal cavity (61) of the bulb, the cavity volume is uniformly, evenly filled with electrically conducting substance (62) such as steel or copper cuts (chips), which has electric contact with the discharge electrode (63). The bulb is fixed to the casing (43) by means of dielectric adapters (56, 57, 58, 59).

The plasma generator of the invention is a non-linear electronic device which generates unipolar (from one electrode) soliton mode discharge. The features of the unipolar discharge are dependent on resonance adjustment (amplitude, frequency, phase), on power level and high voltage level and on the type of the plasma head. The plasma head like the one depicted in FIG. 9B is optimum for plasma therapy in general and for plasma puncture in particular, because the plasma beam can be generated about 10 mm length and less than 1 mm diameter. The plasma head given in FIG. 10 forms three-dimensional (solid) discharges which are close to spherical symmetry of several types. These varying, moving cord-like discharges which diffuse three-dimensional discharges present soliton analogs of corona and spark discharges in linear circuits and devices.

The operation mode of the preferred embodiment of the plasma generator of the invention is described in detail with references on the accompanying drawings.

Parametric resonance is excited in the primary resonance circuit (13) (see: FIG. 1), which corresponds to the generalized electromagnetic induction law, charge and magnetic flow total (perfect, exact, ordinary) differentials, dQ and $d\Psi$, connected to the primary circuit being represented by the following equations:

$$dQ_0 = C_0 du_0 + u_0 dC_0 \atop d\psi_0 = L_0 di_0 + i_0 dL_0 \quad (1)$$

wherein, $C_0$ is equivalent capacitance;

$L_0$ is equivalent inductance;

$u_0$ is voltage; and, $i_0$ is current in the generalized resonance circuit.

A non-linear cyclic transient of reactive energy accumulation and conversion is formed in the generalized resonance circuit (in terms of electric circuitry and field). The modulating transistor (3) induces free reactive power twice a period of free sine-shaped oscillation of charge ($dQ_0$) and magnetic flow ($d\Psi_0$) at the moments of the network switching on and off. This free reactive power is emitted and absorbed by the resonance circuit.

Non-linear features of the parametric resonance circuit are defined by three non-linear components: i.e., non-linear capacitor (17), ferrite core (22) and key-mode component (3) (for instance, transistor).

The resonance circuit non-linearity and dispersion in terms of field processes are determined not only by the materials of the network components, but by the design of the network. The network integrates elements which function as transfer line, forming line and step-up transformer. The induction resonance process in this system differs from classical soliton excitation in electronic device. Combination, integration of various functions in single device (when the wave resonance is described by partial differential equations) brings about resonance matching of the generating resonance circuit and the load (which is the discharge). This resonance matching appears in stable field and plasma-optical solutions induced by plasma head (5).

Figure 2A:
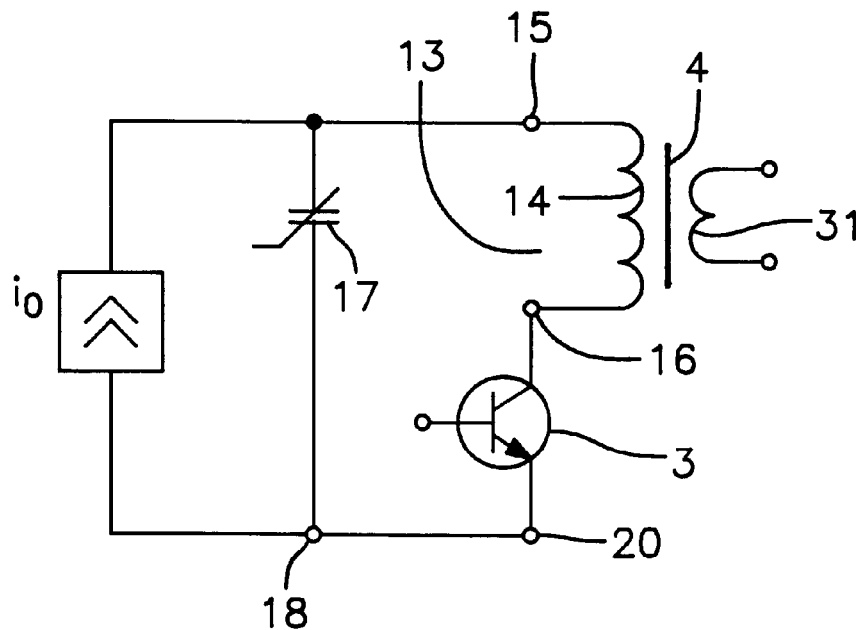
FIG. 2A is an unit-block diagram of the primary parametric resonance circuit.
Figure 3:
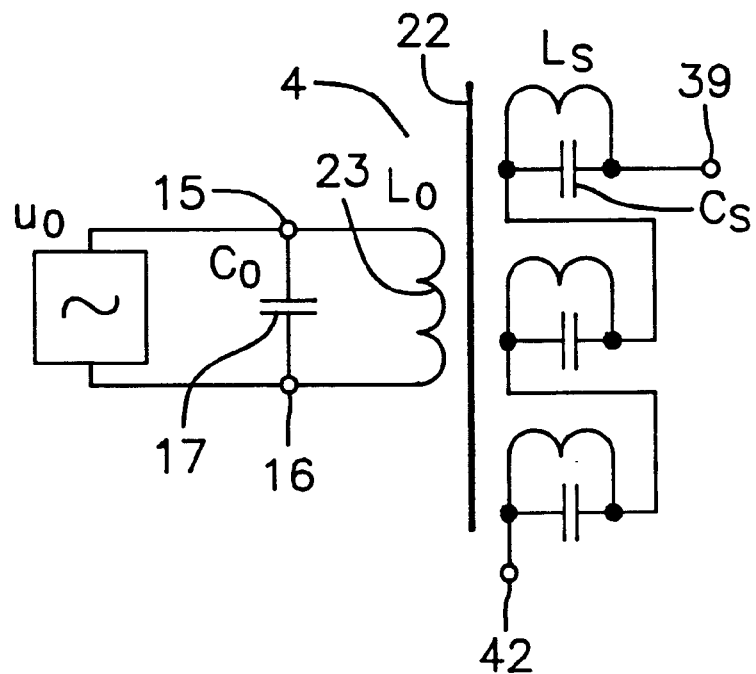
FIG. 3 is a substitution schematic diagram to the resonance transformer with regard to sine-shaped signal flow.
Figure 4:
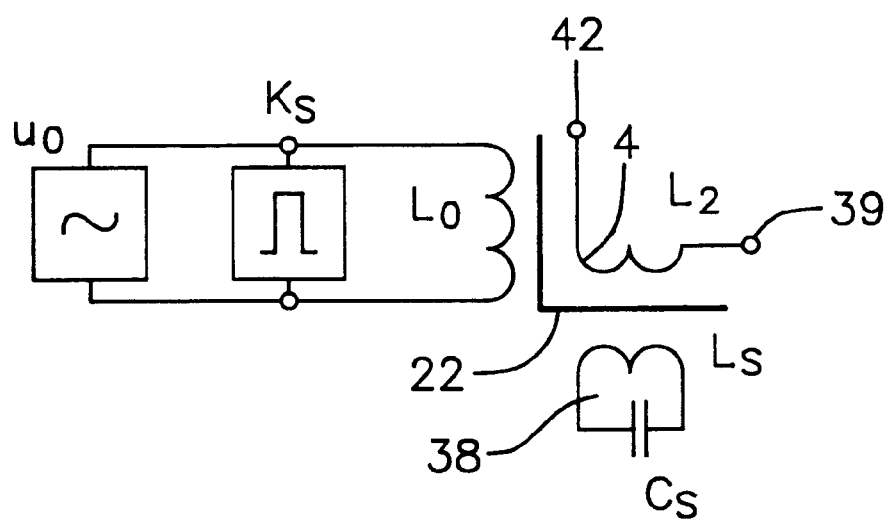
FIG. 4 is a substitution schematic diagram to the resonance transformer with regard to binary driving signal flow.
Figure 5:
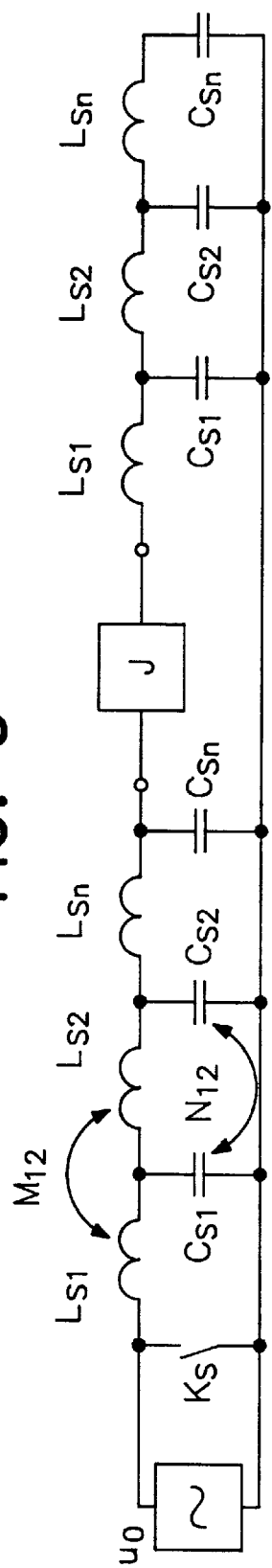
FIG. 5 is a substitution schematic diagram to the secondary multi-layer winding of the transformer considered as a double forming line.

Therefore, the schematic diagram of the primary resonance circuit characterized by generalized parameters $\{Q_0, \Psi_0, i_0, u_0, L_0, C_0\}$ in accordance with the equations (1) and circuitry design of FIG. 2A can be converted into a set of substitute schematic diagrams. This set of substitute schematic diagrams displays the development of the induction process both in time and in the proper space of the generalized resonance circuit. Possible variants of such substitute schematic diagram set are represented in FIGS. 3 to 5.

Figure 6A:
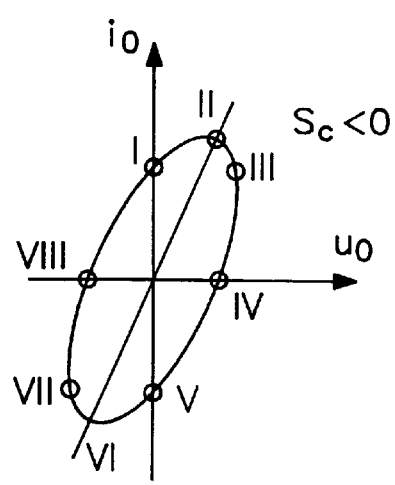
FIG. 6A is a curve of current versus voltage at the double forming line in the mode of reactive power generation, $Q_c<0$.
Figure 6B:
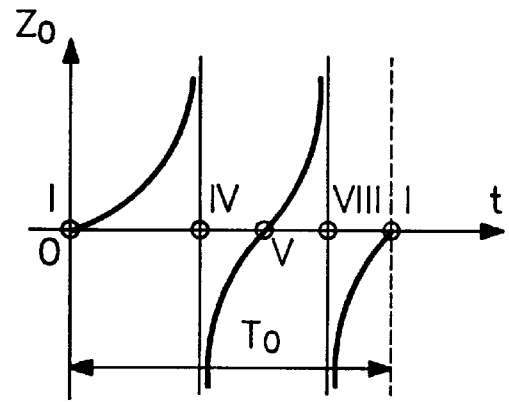
FIG. 6B is a plot of instantaneous reactive resistance in the resonance circuit.
Figure 7:
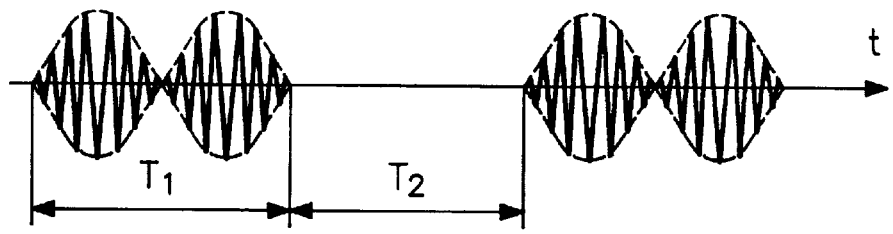
FIG. 7 shows soliton generation process in the secondary (high voltage) section of the resonance transformer, the secondary section functions in a forming line mode.

FIGS. 6 and 7 depict some features of the induction process.

The following designations are used: $L_s$ and $C_s$ denote inductance and capacitance of layers of the resonance transformer secondary winding (31). These layers function as transfer line for the sine-shaped signal ($u_0$) and they function as forming line at the moments of the key component (transistor) driving to conduction and driving to cut-off (the key component is shown in FIG. 5 as $K_s$). If all the layers have the same number of turns we can roughly consider $$L_{S1} = L_{S2} = \ldots = L_{Sn} \atop C_{S1} = C_{S2} = \ldots = C_{Sm} \quad (2)$$

wherein, n is the number of layers of the secondary winding.

The induction process in the resonance circuit under consideration is described not only with circuitry equations, but also with equations for Poynting's flow which closes on itself inside the proper space of the generalized network.

It can be shown that the second terms in equations (1) generate scalar electric field $E_0$ and scalar magnetic field $H_0$.

Therefore, the complete substitute circuitry of the layers of the transformer winding which functions as a line (see:FIG. 5) represents double line. In FIG. 5, the left and right parts of the double line represent the induction process versus time (1/dt) and the induction process versus space coordinates (1/dx), respectively.

There exists direct and reverse (feedback) magnetic and electric couplings between the double line elements, i.e., $M_{12}$ and $N_{12}$. The load for the double forming line is a current source J which reflects the process of plasma generation. A similarity of this phenomenon to Josephson effect will be demonstrated later.

Another characteristic feature of the set of the substitute schematic diagrams of the soliton induction process consists in reactive form of the spatial currents in the line. Therefore, in order to reflect "orthogonal turn" of the Poynting's flow in the parametric circuit the magnetic network is shown as orthogonal one in FIG. 4. This process for magnetic flow has the following expression:

$$\frac{d\psi_0}{dt} = L_0 \frac{di_0}{dt} + i_0 \frac{dL_0}{dt} \quad (3)$$

wherein, $$105_0 = L_0 i_0 \quad (4)$$

The conditions of the parametric resonance excitation are:

$$\omega_0 = \omega_1 \quad (5)$$

$$\omega_0^2 = \frac{1}{L_0 C_0} \quad (6)$$

$$m > 2Q \quad (7)$$

wherein, $\omega_0$ is the proper resonance frequency of the circuit, the frequency of discharge in the plasma head (5) being equal to the $\omega_0$;

$\omega_i$ is the frequency of $u_0$ source;

m is modulation coefficient of generalized inductance; and,

Q is the circuit merit factor.

Figure 2B:
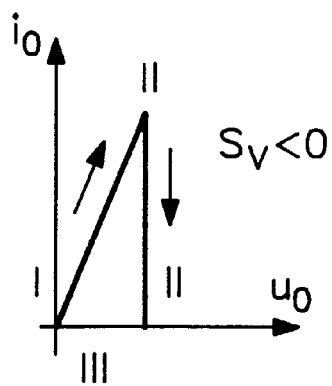
FIG. 2B is a curve of current versus voltage at the key element (key-mode transistor)
Figure 2C:
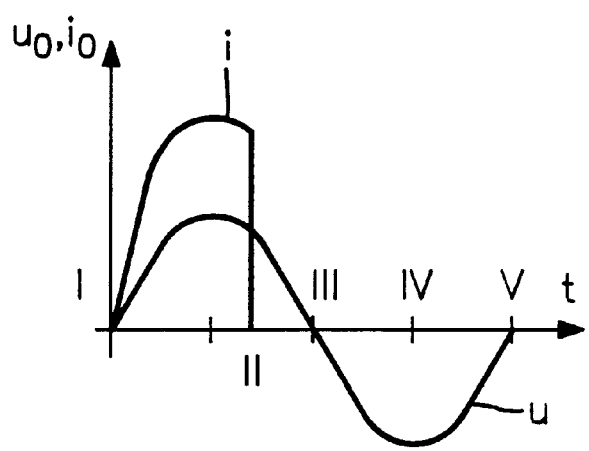
FIG. 2C is a plot of current and voltage in the resonance circuit.

FIGS. 2B and 2C illustrate the mechanism of the spatial reactive currents generation in the circuit given in FIG. 2A. The current-against-voltage curve of the key component (transistor) which drives to cut-off at the moment II has the shape of triangle. This triangle bounds an area proportional to the valve reactive power. Given the direction of tracing as shown with arrows in FIG. 2B this power is negative $S_v<0$. It means that the Poynting's flow generation takes place in the circuit. When the key component (3) is driving to conduction this energy is, oppositely, absorbed $S_v>0$. Thus a current source $i_0$ acts in the generalized network. Formula (3) demonstrates that this current source $i_0$ forms the parametric part of the induction process $i_0 \, dL_0/dt$. The transient under consideration is described by Mathieu equation which is at definite initial conditions equivalent to non-linear Schrödinger equation. The latter characterizes soliton excitations in the system.

FIG. 6A shows the current versus voltage characteristic of the double forming line (see: FIG. 5) which is the generating part of the parametric resonance circuit (see: FIG. 2). The area bounded by the curve is proportional to the generated power of the plasmoid. The generation occurs only when the ratio of the $u_0$ and $i_0$ instantaneous values varies:

$$z_0(t) = \frac{u_0(t)}{i_0(t)} = \text{var} \tag{8}$$

In those modes when $z_0(t)$ is constant and $S_0=0$, the soliton field excitations do not occur and the device functions in linear mode.

FIG. 7 presents one of the variants of soliton waves in the parametric circuit.

For the two types of the plasma head described above which have rod-like unipolar electrode depicted in FIG. 9B and quasi-spherical electrode inside double wall bulb depicted in FIG. 10, the discharge process starts and completes at the same single electrode. In both cases the soliton has a core and a tail ("fur-coat"): The core is observed as a bright luminescence (thin layer) around the main electrode and it contains more than 90% of all the energy generated by the parametric circuit, where all generated energy is defined by the area within the current-against-voltage curve in FIG. 6A and the soliton tail contains small part of energy and it forms filaments, cords similar to plasma or diffuse luminescence. They have continuous wide frequency spectrum and they are healthful, they provide positive biotherapeutic effect. Depending on the environment characteristics (atmospheric pressure or vacuum of 1 to 20 mm Hg, that is 133.3 to 2,667 newton per square meter, presence of-argon, helium, neon) as well as on the process intensity ($u_0$ and $i_0$ largeness) and on the value (range) of the main carrier frequency ($\omega_0$) the discharge from the single electrode can be in the form of corona, spark or arc discharge. However, this is actually an induction process in the proper space of the excited parametric circuit. The discharge current J appears as a result of tunneling of the reactive current (or Poynting's flow) through dielectric layer. In other words, the plasma generator presents a reactive analog of Josephson effect device.

If the reactive alternating potential value at the unipolar electrode is $\phi_0$ and the process in the non-linear circuit of FIG. 2 is described by Sin-Gordon equation, the following expression is valid:

$$\frac{\partial^2 \phi_0}{\partial x^2} - \frac{\partial^2 \phi_0}{\partial t^2} = \sin\phi_0 \tag{9}$$

wherein, $$\frac{\partial \phi_0}{\partial t} = \frac{2\pi}{\psi_0} u_0 \tag{10}$$

$u_0$ corresponds to the potential difference at the Josephson contact. In our case $u_0$ is defined by parametric resonance and the circuit transformation factor. Therefore, from the formulae (9) and (10) and from the substitution schematic diagram FIG. 5 it follows that the plasma generator output current J is determined by:

$$J = i_0 \sin\phi_0 \tag{11}$$

The stable form of the soliton reactive current depends on the generalized resonance circuit non-linearity and dispersion which are defined by non-linear materials and geometrical proportions of the transformer (see: FIG. 8). Optimum proportions for the frequency range $f_0=20-100$ kHz are the following:

$$\left. \begin{array}{c} 0.3 < \dfrac{D_1}{D_2} < 0.5, \\ 2 < \dfrac{h_1}{D_2} < 3 \end{array} \right\} \tag{12}$$

wherein, $D_1$ and $D_2$ are the inner and the outer diameters of the secondary cylindrical winding; and, $h_1$ is the length of the secondary cylindrical winding.

Certain specific variants of the rod-like electrode were implemented with the following dimensions (see: FIG. 9B): the length $l_0=10-15$ mm, the diameter $d_0 =$ approx. 1 mm, the emitter length $\Delta=2-4$ mm. The material was bronze and plating was gold.

The accommodating (dividing, decoupling) capacitor (41) before the rod-like electrode changes the soliton core localization and the conventional potential difference at the Josephson contact. Thus the requirements of plasmapuncture are met (to reduce the output potential $\phi_0$). The value of 2–50 pF is practical.

The power consumption of medical, biological applications of the generator does not exceed 2–40 W. The output potential $\phi_0=0.5-10$ kV. The carrier resonance frequency $f_0=20-200$ kHz. The rod-like electrode with pointed emitter provides for visible plasma beam formation about 10 mm length, tens or hundreds of micrometer diameter. This is fairly useful, functional for plasma-puncture.

Any functional part of the invented plasma generator can be combined, either completely or in a certain portion, with another functional part (or other functional parts) in a single unit, component, device (in a number of units, components, devices).

Various types and modifications of the discharge electrodes (working probes, working heads) and auxiliary extensions to them can be used.

The discharge electrode made of electrically conducting material (substance) can have another, especial form, different from the pointed rod.

The plasma generator can have the discharge electrode coming to the inner space of hermetically sealed dielectric bulb, envelope, filled with gas and/or liquid and/or solid structure, the pressure and the composition of the gas and other parameters of the contents of the bulb, envelope, being chosen in accordance with the specified requirements on the plasma features.

The discharge electrode dielectric or semiconductor extensions can be used as well. The discharge electrode gas and/or aerosol and/or liquid dynamic extensions can be used; they present gas and/or aerosol and/or liquid stream (jet) produced by special device. A compressor, a fan, or a bottled gas, gas cylinder can be used in such device.

The discharge electrode extension can also present a combination of electric conductor and/or semiconductor and/or dielectric and/or mixed composition parts, components, elements of arbitrary forms and in arbitrary geometrical and electrical configurations, and among those parts, components, elements there can be common, ordinary and/or special, original devices, components, for instance, there can be sealed, hermetic dielectric bulbs, envelopes, either exhausted or filled with some substance or some composition of substances.

Plasmon beam (64) similar to the plasmon beam shown in FIG. 9 can also be formed by composite conductor & dielectric (6 & 65) tube electrode assembly presented in FIG. 11A. Gas (66), neutral for instance, is coming into dielectric tube (65) and then the gas is being magnetically activated during passage inside parametric resonance transformer (4) to form gas-magnetic focusing lens (67) around the beam (64). The metal tube section (6) can be built in dielectric sleeve (68) that functions as an isolator mounting support for high voltage lead (39) of the resonance transformer (4).

The discharge electrode extension can be formed not only by gas flow (stream) but also by liquid (fluid) and/or aerosol flow generated by special device. FIG. 11B displays plasmon head with tube electrode assembly. It can contain a number of dielectric (65) and conductor (metal) (6) elements in line. The processing zone (technological space) (69) filled with water system or another liquid, fluid (70) is activated by both beam (64) and flow (67).

Figure 11C:
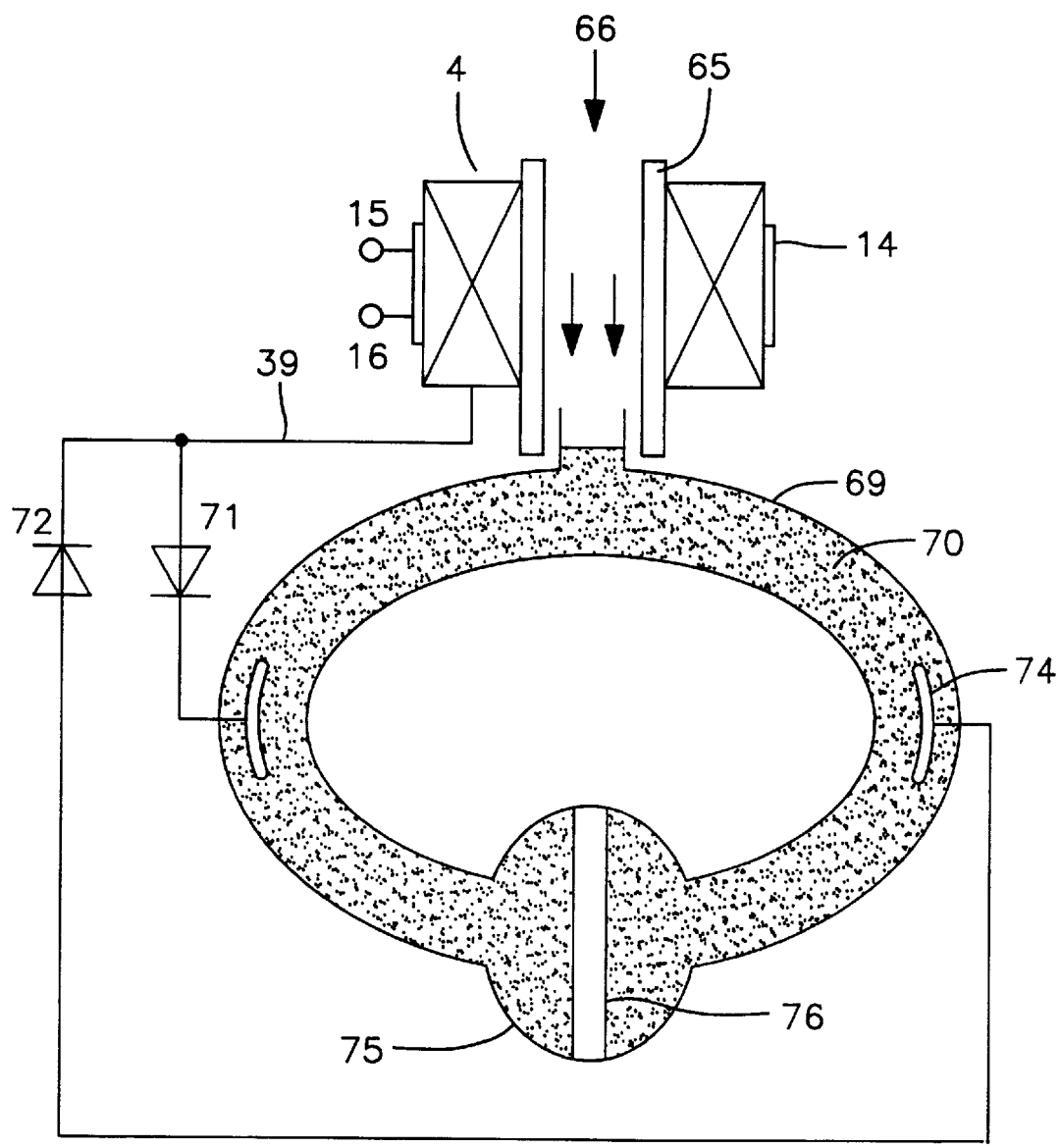
FIG. 11C shows plasmotron head (unit) with dielectric ring electrode assembly and semiconductor diode polarizers for activation of liquids, fluids, for instance, water solutions (systems)

Plasmon unit can also contain two high frequency high voltage semiconductor diodes, (71) and (72), connected to the lead (39) of the resonance transformer (4) as shown in FIG. 11C. The processing (technological) chamber (69) is filled with substance (70), it can be gas and/or liquid and/or aerosol and/or powder, dust. Conductor electrodes (73) and (74) are placed symmetrically against the resonance transformer (4) axis. The ring chamber (69) can be made of molybdenum glass or quartz, it has a spherical expansion (75) in which a filter (76) is built.

Figure 11D:
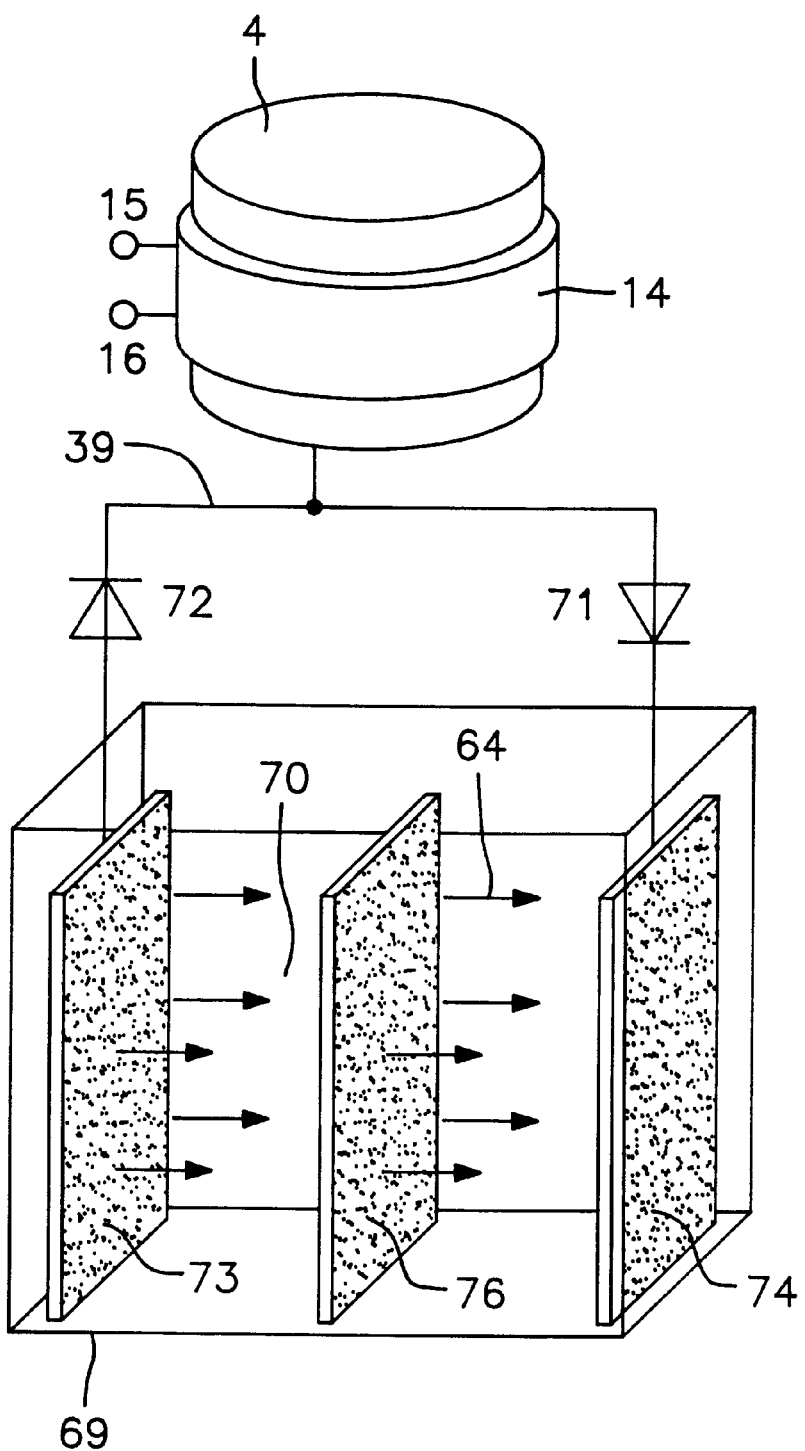
FIG. 11D shows plasmotron unit with polarizing semiconductor elements and conductor plate electrode assembly.

FIG. 11D shows technological chamber with metal electrodes (73) and (74) made as plates of metal which actively absorbs hydrogen, it can be zirconium, titan, niobium, tantalum. The discharge currents (64) that pass between the electrodes (73) and (74) can have the form of diffuse discharge which fills all the volume of the medium (70) being activated. In this case the walls of the chamber work as catalyst for various reactions in the area of contact with the medium.

In the plasma generators of FIGS. 11C and 11D the load currents in the mode of parametric resonance are formed as soliton waves. These soliton waves consist of quasi-particles of various types (for instance, of magnons and phonons). Varying the material and the shape of the electrode and electrode extension (metals, alloys, semiconductors, dielectric) one can vary intensity and form of the quasi-particles currents in plasmon unit. These currents are originated as non-force collective excitation of crystal structures at the surface and inside the body of electrode assembly. If excitation of electrons in the crystal body of electrodes (6) dominates, the load currents are produced in the form of plasmons (waves and quasi-particles in the pulse space of metal electrodes). Semiconductor diodes (71) and (72) induce parametric excitation of excitons (electron—electron vacancy pair) in the semiconductor crystal structure. Dielectric electrode extensions (69) which work as the processing chambers induce also specific quasi-particle types (at the surface and inside the body), polarons. The polarons are caused by the chosen dielectric polarization.

FIGS. 12A, 12B, 12C and 12D show various plasmon-optic units which serve both as converters and as loads for soliton waves. These soliton waves consist of direct and reverse currents of quasi-particles.

Figure 12A:
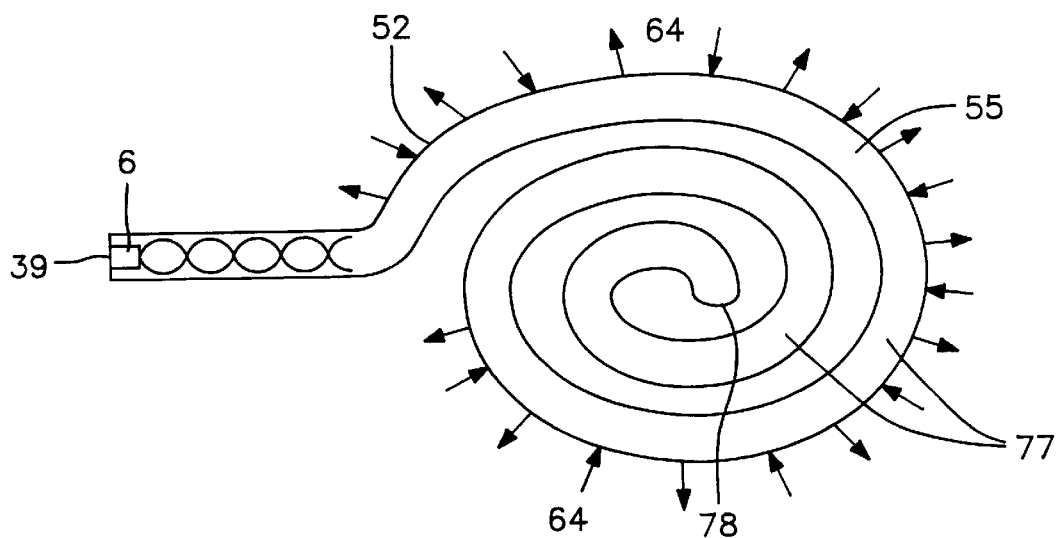
FIG. 12A shows plasmon-optic head (unit) in the form of flat spiral tube, bulb with conductor electrode at the end.

The optic head (unit) in the form of flat spiral tube (77), FIG. 12A, is excited from high voltage lead (39) and conductor cylinder electrode (6). The envelope (52) is made of glass. The end (78) of the tube is hermetically sealed. The internal space (55) is filled with low-pressure gas, it can be neutral, for instance. So, the unit is constructed as a single pole (monopolar) tube with one lead electrode (6) which induces a package of soliton waves-currents into the working volume. These soliton waves-currents consist of plasmons and optical phonons which form quantum flow (64) at the surface (52). The quantum flow (64) consists of mutually converted photons and optical phonons.

Figure 12B:
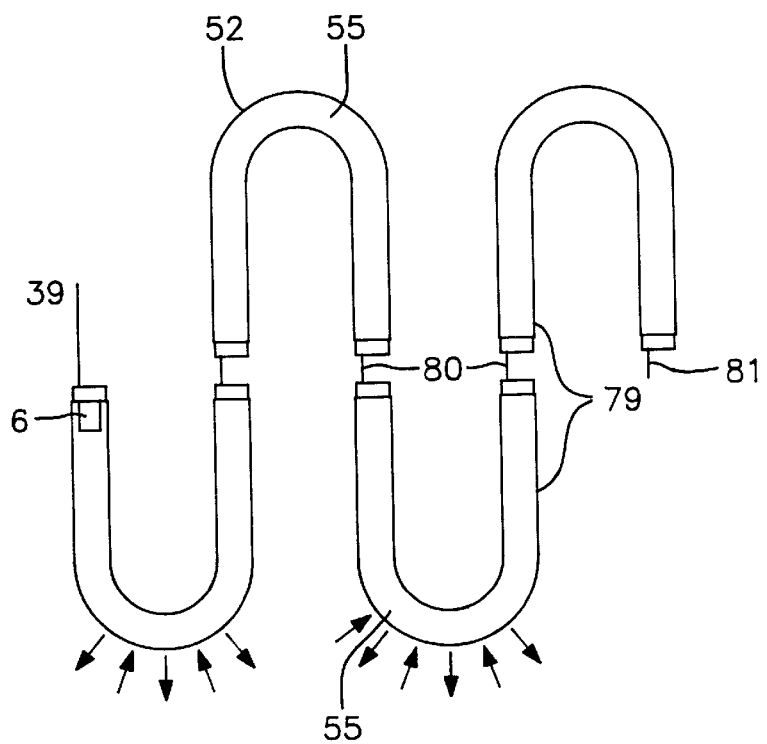
FIG. 12B shows plasmon-optic head (unit) with U-shaped gas-discharge tubes connected in series.

Plasmon-optical unit can also be assembled from common, general U-shaped gas discharge tubes with luminescent lining (79) (see: FIG. 12B). The tubes are connected in series, "snake-like". The connections are made by conductor electrodes (80), and an electrode (81) is connected to the end of the assembly. During emission of optical phonons and tunneling of currents according to formulas (9)–(11) the alternating parametric high voltage from the lead (39) is transferred to all the intermediate electrodes (80) and the final electrode (81).

Figure 12D:
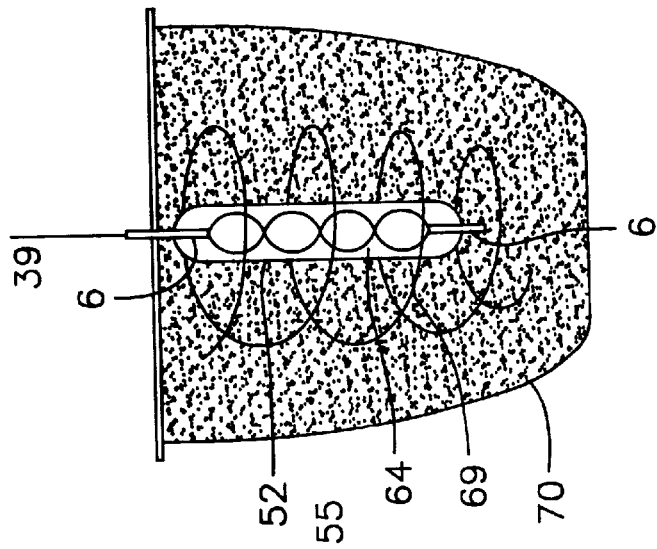
FIG. 12D shows plasmotronic unit with tube having two electrodes at the ends which forms rotating soliton field.
Figure 12C:
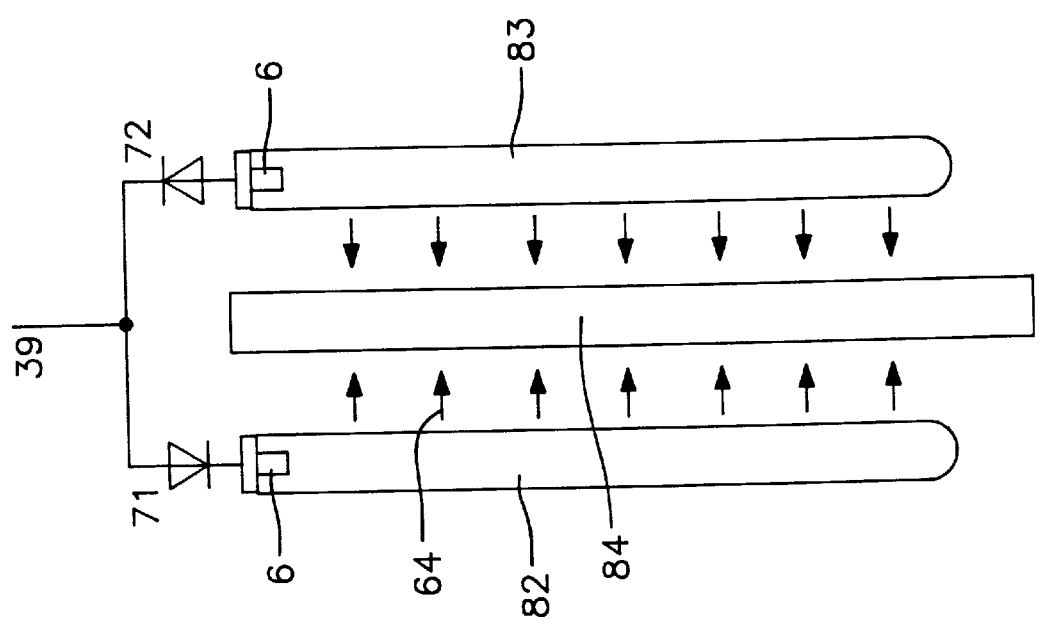
FIG. 12C shows plasmon-emission unit with semiconductor polarizers and a system of gas-discharge tubes placed so that to form special spatial configuration.

Optical unit displayed in FIG. 12C generates effectively currents of quasi-particles (excitons and polarons). The dielectric (tube) sub-units (82) and (83) can be the flat spiral tubes (FIG. 12A) or the "snake-like" U-tube assemblies (FIG. 12B) or "flat array" assemblies from general rod-shaped gas discharge luminescent tubes. Monopolar connection to the parametric resonance lead (39) is implemented by metal electrode (6) and semiconductor diodes (71), (72) (high frequency high voltage diodes). In this case the object (84) of activation, processing (resonance control of parameters) is placed in the middle of the space between the two polar optical sub-units (82) and (83).

A cylindrical vacuum tube (bulb) with glass envelope (52) and two metal rod electrodes (6) at the ends can be used for activation of gas and/or liquid (fluid)(see: FIG. 12D). During the course of rising of voltage at the lead (39) a wave current process is developing from the upper electrode (6) in the form of two solid (3-D, spatial) sinusoids. These two sinusoids are growing and then reach the lower electrode (6). After it the two sinusoids begin to rotate about the vertical symmetry axis. Emission (64) covers the technological chamber (69) and interacts with the medium (70) to be processed. This emission consists of several types of quasi-particles (plasmons, phonons, magnons).

Figure 13A:
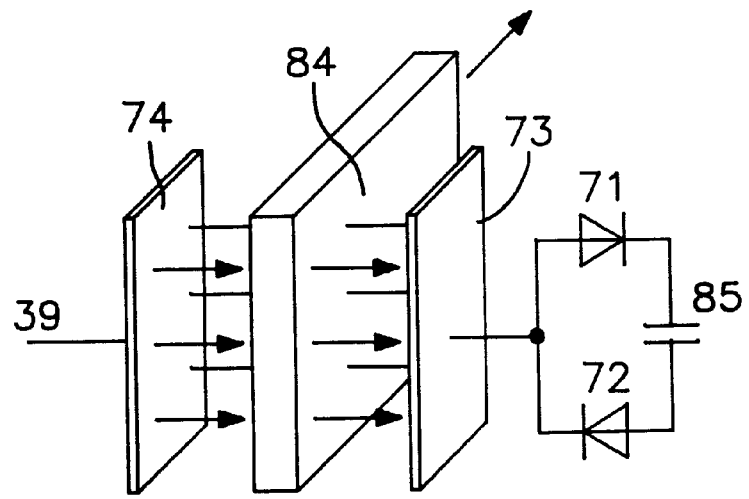
FIG. 13A shows emission unit with flat electrodes for activation of plates, wafers, films.

The plasmotronic load unit of the generator can be implemented as a system of flat conductor plates (73) and (74) shown in FIG. 13A. The object of activation (84), such as dielectric film, wafer, plate, is placed between the conductor plates (73), (74). Semiconductor diodes (71) and (72) are connected to the flat electrode (73). Capacitor (85) closes the diodes. The flow of quasi-particles (64) which transfers the charges, currents in the gape (space) between the plates (73) and (74) can be considered as Josephson current which tunnels through dielectric (the object) in accordance with equations (9)–(11). The excessive, extra charge transferred by the quasi-particles (polarons, excitons, etc.) is accumulated and charges the capacitor (85). Thus the flow of reactive power can be controlled and the technological process can be adjusted, optimized.

Figure 13B:
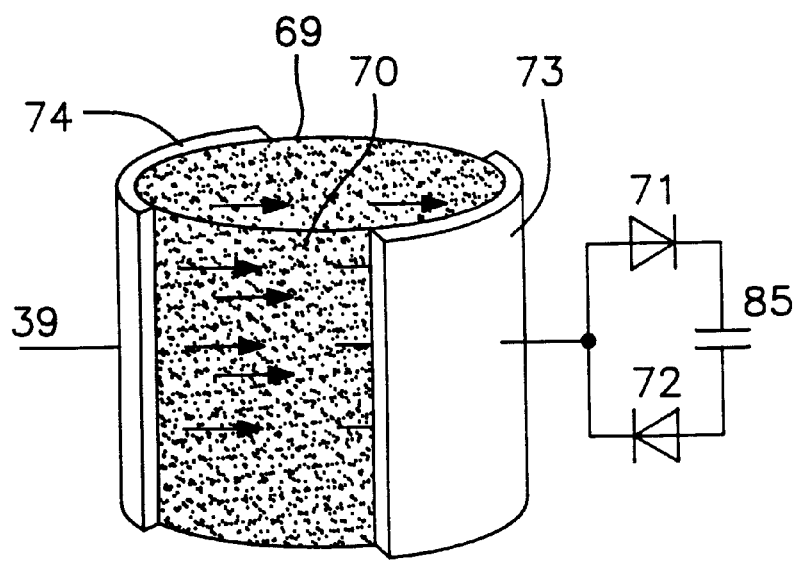
FIG. 13B shows plasmotronic unit with flat or semi-cylinder electrodes for volume (3-D, solid) polarization and activation of powders, dusts as well as gases, fluids, liquids.

FIG. 13B shows technological plasmotronic unit for processing of free-flowing bulk materials in order to control their properties, features. This unit is also used to control the properties of polycrystal substance in the state of phase transition. For instance, the unit is used to control the process of silicon monocrystal (single crystal) growing by Chokhralsky method. The technological chamber (graphite or quartz crucible) (69) with polycrystal substance (silicon) (70) is placed in the center of semi-cylinder electrode structure (73), (74). The electrodes (73) and (74) are made of refractory, high-melting-point metal. They also function as heat shields. The flow (64) of reactive quasi-particles passes the technological zone between the electrodes and brings about resonance parametric excitation of the processed substance. Such parameters of the substance as heat capacity (specific heat), magnetic susceptibility or dielectric constant (permittivity) can be varied. It is possible to predict, to design and realize various types of phase transition, to derive, obtain various properties, parameters of substance if the dispersion characteristics of the processed substance (load) and the type of non-linearity of the parametric resonance generator are known.

Figure 13C:
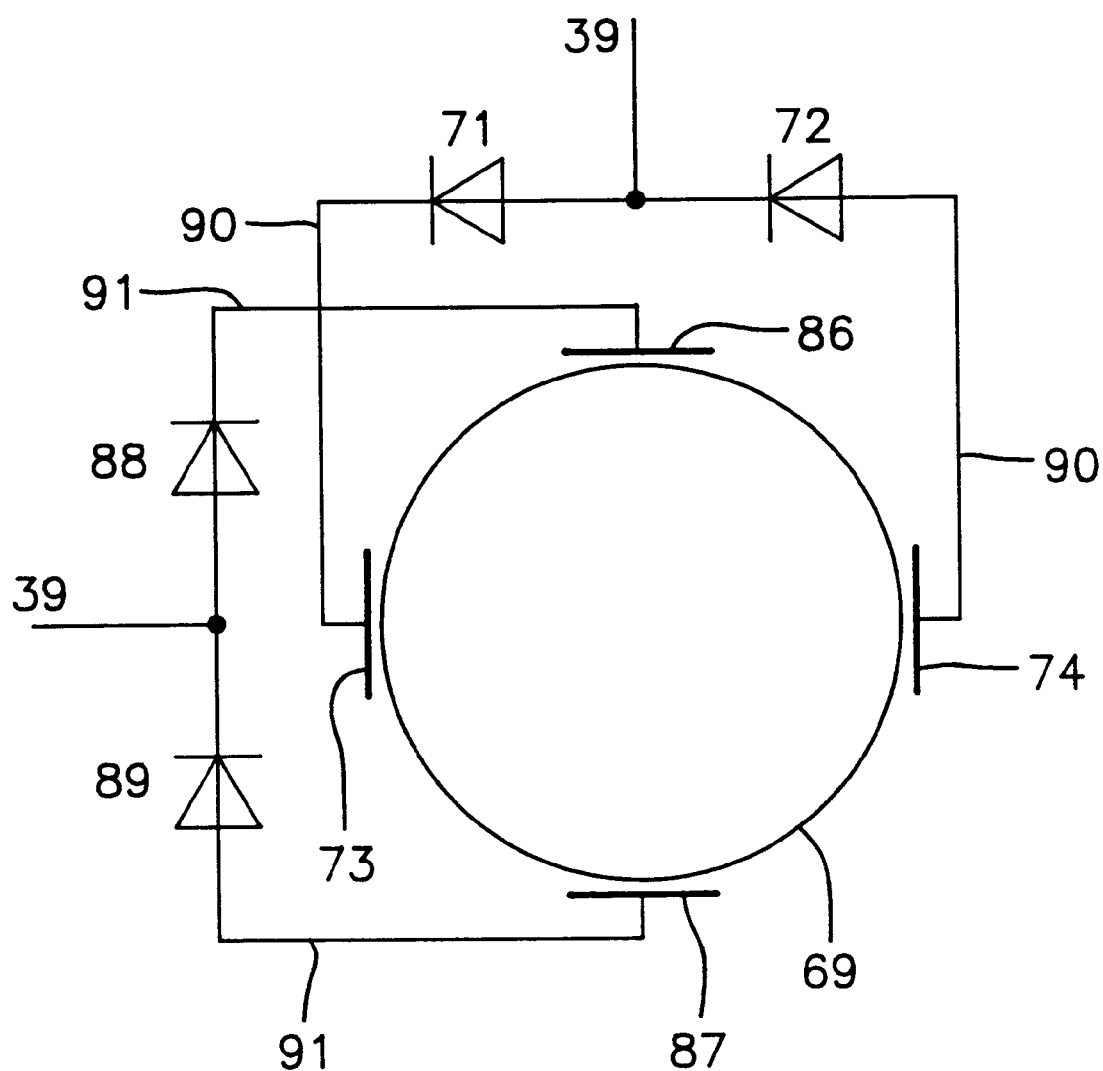
FIG. 13C shows plasmotronic quadrupolar electrode system for activation of the technological zones, areas, volumes.

Metal electrode system can be quadrupolar, as shown in FIG. 13C. Additional pair of electrodes (86), (87) is installed across the first pair (73), (74). The additional electrodes are connected through semiconductor diodes (88) and (89).

Figure 14A:
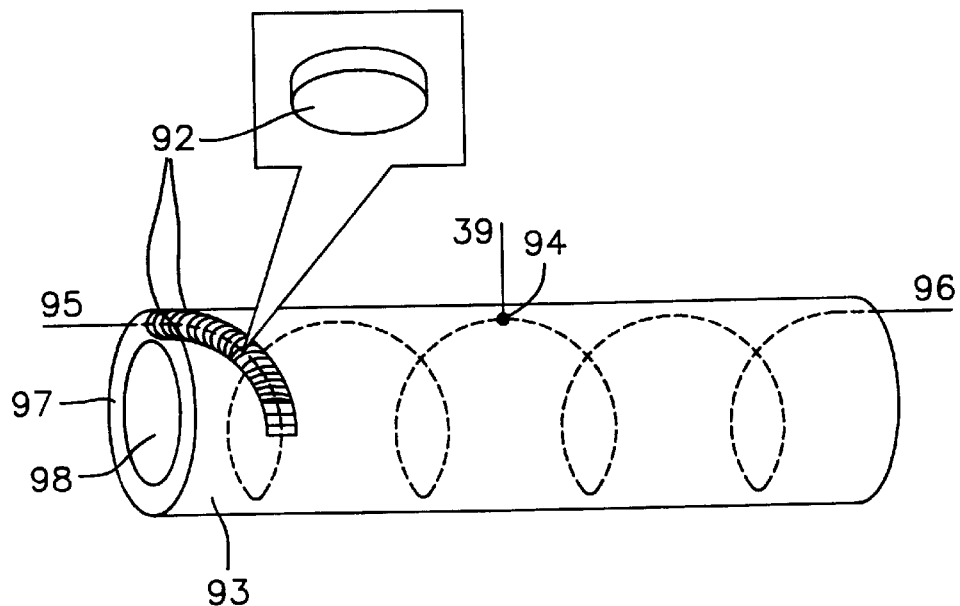
FIG. 14A shows construction of pipe-shaped electrode extension with tablet (button) semiconductor diodes placed along a helical line.
Figure 14B:
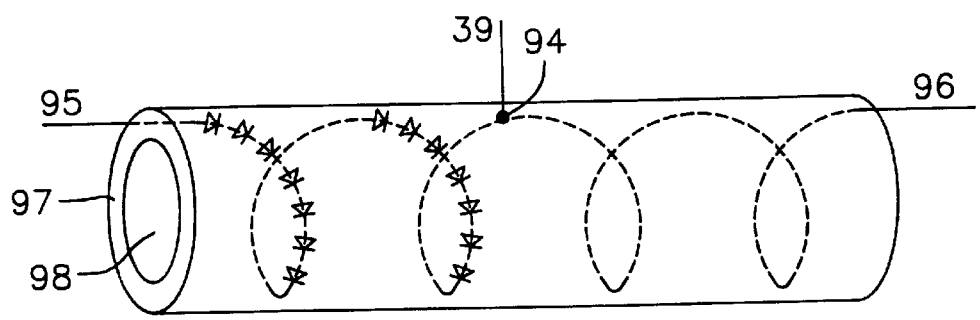
FIG. 14B shows circuitry diagram of pipe-shaped electrode extension with tablet (button) semiconductor diodes placed along a helical line.

FIG. 14 shows pipe-shaped structure (93) with tablet (button) diodes (92). The diodes can be encapsulated, baked, caked, sintered in epoxy compound along helical (helix) line in cylinder layer (97). The cylinder hollow (98) serves as the passage of the processed gases and/or aerosols and/or liquids (fluids) and/or free-flowing bulk substances.

What is claimed is:

1. A plasma generator for generating unipolar plasma, comprising;
   means for transforming a resonance having a low voltage input section and a high voltage output section, wherein the high voltage output section includes a pin;
   first means for generating an oscillation signal having an amplifying element, wherein the amplifying element is connected to the low voltage input section;
   second a single discharge electrode for generating and supplying a power to said first means for generation; and
   means for discharging cold unipolar plasma connected to the pin of the high voltage output section.

2. The plasma generator of claim 1, further comprising a coupling means placed between the high voltage output section of said means for transforming and said means for discharging.

3. The plasma generator of claim 1, wherein said means for discharging is a discharge electrode made of electrically conducting material which includes pointed, sharp emitter.

4. The plasma generator of claim 3, wherein the discharge electrode is contained in an inner space of hermetically sealed dielectric bulb envelope filled with gas, liquid or solid structure, or in combination of gas, liquid and solid structure, whereby pressure and composition of material in the inner space of the bulb envelope are selected depending on the specified requirements on the plasma features.

5. The plasma generator of claim 3, wherein the discharge electrode is placed inside of double-wall dielectric bulb having outer and inner walls, the bulb is filled with gas, another substance or some complex structure,
   whereby pressure and composition of the gas and other parameters of contents between the walls are selected depending on the specified requirements on the plasma features, and
   whereby an internal cavity of the bulb within the inner walls filled with an electric conductor connected to the discharge electrode.

6. The plasma generator of claim 1, wherein said means for discharging is made of conductor, semiconductor or dielectric, or combination of conductor, semiconductor or dielectric,
   wherein said means for discharging further includes plates being placed in a processing chamber, the plates being connected to two diodes.

7. The plasma generator of claim 1, wherein said means for discharging includes a series of tube elements having common axis, the tube elements being made of conductor, semiconductor or dielectric, or combination of conductor, semiconductor or dielectric.

8. The plasma generator of claim 1, wherein said means for discharging includes a ring dielectric chamber and conductor plates placed in the chamber, the plates being connected to the high voltage output section through two diodes.

9. The plasma generator of claim 1, wherein said means for discharging is formed of spiral gas discharge tube which is connected to the voltage output section.

10. The plasma, generator of claim 1, wherein said means for discharging is formed of a series of U-shaped gas discharge tubes.

11. The plasma generator of claim 1, wherein said means for discharging is made of dielectric chamber in which a dielectric tube is placed.

12. The plasma generator of claim 1, wherein said means for discharging includes two gas discharge tubes which are connected to the high voltage section through two diodes.

13. The plasma generator of claim 1, wherein said means for discharging includes conductor plates, whereby one of the plates is connected to two diodes and a capacitor in series.

* * * * *

UNITED STATES PATENT AND TRADEMARK OFFICE
CERTIFICATE OF CORRECTION

| | | |
|---|---|---|
| PATENT NO. | : 5,909,086 | Page 1 of 1 |
| APPLICATION NO. | : 08/719057 | |
| DATED | : June 1, 1999 | |
| INVENTOR(S) | : Kim et al. | |

It is certified that error appears in the above-identified patent and that said Letters Patent is hereby corrected as shown below:

Col. 11, line 27, the text "second a single discharge electrode" should read -- second means --.

Col. 11, line 31, the text "means" should read -- a single discharge electrode --.

Signed and Sealed this
Twenty-first Day of June, 2011

David J. Kappos
*Director of the United States Patent and Trademark Office*